US 6,674,621 B2

(12) United States Patent
Teutsch et al.

(10) Patent No.: US 6,674,621 B2
(45) Date of Patent: Jan. 6, 2004

(54) IC PMOS SCHOTTKY REVERSE BIAS PROTECTION STRUCTURE

(75) Inventors: Alexander Noam Teutsch, Dallas, TX (US); Zbigniew Jan Lata, Dallas, TX (US); David John Baldwin, Allen, TX (US); Ross E. Teggatz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 09/989,066

(22) Filed: Nov. 21, 2001

(65) Prior Publication Data

US 2002/0060889 A1 May 23, 2002

Related U.S. Application Data

(60) Provisional application No. 60/252,371, filed on Nov. 21, 2000.

(51) Int. Cl.[7] .................................................. F21V 7/04
(52) U.S. Cl. ............................ 361/31; 361/87; 361/91.5
(58) Field of Search .............................. 361/23, 31, 87, 361/93.1, 93.9, 82, 91.5, 91.6; 307/127

(56) References Cited

U.S. PATENT DOCUMENTS 5,654,858 A * 8/1997 Martin et al. ................. 361/56
5,744,921 A * 4/1998 Makaran ..................... 318/254

* cited by examiner

Primary Examiner—Michael Sherry
Assistant Examiner—Gary L. Laxton
(74) Attorney, Agent, or Firm—J. Dennis Moore; W. James Brady, III; Frederick J. Telecky, Jr.

(57) ABSTRACT

The present invention relates to a reverse bias protection structure which comprises a PMOS transistor structure having a drain portion, a gate portion, a source portion and a backgate portion, wherein the gate portion is coupled to a first voltage potential, the source portion is selectively coupleable to a power supply, and the drain portion is selectively coupleable to a circuit needing power to be supplied thereto from the power supply. The reverse bias protection structure further comprises a Schottky diode structure having an anode coupled to the source portion of the PMOS transistor structure, and a cathode coupled to the backgate portion of the PMOS structure. Under forward bias conditions, the PMOS transistor conducts and exhibits a small voltage drop thereacross. Under reverse bias conditions, the PMOS transistor is off and the Schottky structure is reverse biased, thus preventing current through the protection structure.

4 Claims, 3 Drawing Sheets

IC PMOS SCHOTTKY REVERSE BIAS PROTECTION STRUCTURE

This application claims priority under 35 U.S.C. §119(e)(1) of provisional application Ser. No. 60/252,371, filed Nov. 21, 2000.

FIELD OF THE INVENTION

The present invention relates to electronic circuits and, more particularly, to a circuit, system, structure and method for protecting various circuits from unwanted reverse current flow under various conditions.

BACKGROUND OF THE INVENTION

Electronic circuits are employed in numerous consumer and industrial applications. Such applications are extremely diverse; from computers, to wireless portable communications devices, to industrial controls, etc. In such myriad applications, the electronic circuits, typically fabricated and packaged as integrated circuit (IC) chips, are utilized to achieve various types of functions, for example, digital control, digital-to-analog (D/A) or analog-to-digital (A/D) conversion, mixed signal analysis, etc.

One exemplary circuit application relates to the drive and control of DC cooling fans which are employed in systems such as portable, notebook computers. Such cooling fans operate to cool the various notebook computer components located therein and are controlled using, for example, a DC brushless motor. The DC brushless motor, in turn, is driven and controlled by a control system, as illustrated in prior art FIG. 1, and designated at reference numeral 10.

The exemplary system 10 includes a fan speed controller circuit 12 and a fan driver circuit 14. The fan speed controller circuit 12 provides a control signal, for example, a pulse width modulation (PWM) signal to the fan driver circuit 14 based on a desired fan speed. The system 10 further may include a motor position detection circuit 16 such as a Hall sensor which monitors the relative rotor/stator position of the DC brushless motor 18 and provides motor position information back to the fan driver circuit 14 for commutation control thereof.

The system 10 of prior art FIG. 1 is powered by a system power supply 20, for example a 5V DC battery. In such systems where circuits such as the fan driver circuit 14 interface with the power supply 20, protection mechanisms such as an external blocking diode 22 often are employed to prevent a reverse bias system condition from causing a reverse current to flow through the fan driver circuit 14 back to the power supply 20. In some cases such reverse current flow can be destructive to the fan driver circuit 14, the system power supply 20 or the fan itself. In reverse bias conditions, for example, when the fan is plugged in backwards, a reverse current will conduct through the circuit 14 to the power supply 20. By employing the blocking diode 22 as illustrated in prior art FIG. 1, the diode becomes reverse biased under such conditions and no such reverse current conducts therethrough.

Use of blocking diodes such as the diode 22 of FIG. 1, however, has several disadvantages. For example, such a solution limits the power supply voltage of circuits such as the fan driver circuit 14 in its normal operating mode. For example, the fan driver circuit 14 may have a minimum voltage supply parameter of about 3.3V and the forward biased diode drop is relatively high (e.g., about 0.5–0.7V) under normal operating conditions. Furthermore, due to the reduced supply voltage provided to the fan driver circuit 14, the maximum revolutions-per-minute (RPMS) of the fan driven by the motor 18 is reduced. That is, since the RPM of the fan is a function of the PWM and the current supplied to the motor 18, a reduced operating voltage reduces the current for any given PWM signal, thereby reducing the RPM of the fan. In addition, because the blocking diode 22 is typically an external type device, the component negatively limits an amount of miniaturization of a system printed circuit board (PCB) and/or makes such a PCB layout more complex, increases PCB component count and increases cost associated therewith.

There is a need in the art for improvements in reverse bias protection devices, circuits or structures.

SUMMARY OF THE INVENTION

The present invention relates to a system and method of preventing reverse currents in circuit applications without sacrificing appreciable voltage headroom under normal operating conditions.

According to one aspect of the present invention, a reverse bias protection structure is disclosed. The protection structure comprises a PMOS transistor and a Schottky diode structure which are configured so as to conduct through the PMOS transistor under forward bias conditions and block current via the Schottky diode structure under reverse bias conditions. Because the PMOS transistor on-resistance is low, its forward bias voltage drop is substantially less than prior art blocking diode type devices, and thus provides additional voltage headroom to circuits which the protection structure is designed to protect.

According to another aspect of the present invention, a system for controlling a component receiving electrical energy is disclosed. The system comprises a system power supply, a component control circuit, the component to be controlled, and a protection structure. The protection structure is associated with the component control circuit and is operable to prevent reverse currents therethrough to the power supply under reverse bias conditions and substantially pass the power supply voltage to the component control circuit under forward bias conditions, wherein the voltage drop across the protection structure in forward bias conditions is less than a forward bias diode drop.

According to yet another aspect of the present invention, a protection structure is disclosed which comprises a PMOS transistor having a source, a gate, a drain and a backgate associated therewith. The protection structure further comprises a Schottky diode structure having an anode and a cathode. The anode of the Schottky diode is coupled to the source of the PMOS transistor and the cathode is coupled to the backgate. The source of the PMOS transistor forms a protection structure input and the drain forms a protection structure output, respectively.

In use, the protection structure may have the input coupled to a power supply or power supply voltage rail and the output coupled to a circuit wishing to employ energy associated with the power supply or rail. In forward bias, normal operating conditions, the gate terminal of the PMOS is coupled to a low voltage potential such that the PMOS transistor is on and the power supply voltage is passed substantially to the output with the voltage drop thereacross being about a $V_{DS(ON)}$ of the PMOS transistor, which is substantially less than a forward bias diode voltage drop. In reverse bias conditions, the source terminal and anode of the Schottky diode are coupled to a low voltage potential and the gate is coupled to a higher potential such that the PMOS transistor is turned off. The backgate potential of the PMOS transistor and the low voltage of the anode of the Schottky diode under such conditions causes the Schottky structure to be reverse biased, and thus prevent reverse current flow through the structure under reverse bias conditions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

The present invention relates to a system and method of preventing reverse currents in a variety of circuit applications without sacrificing an appreciable forward biased voltage drop. For example, under circumstances in which a reverse current may conduct to a power supply, the present invention comprises a PMOS-Schottky structure which prevents such reverse currents under reverse bias conditions. In addition, the PMOS-Schottky structure advantageously provides a small voltage drop thereacross in forward bias conditions, thereby reducing power dissipation and providing additional voltage headroom to circuits employing such a structure over traditional blocking diode device arrangements.

Figure 2:
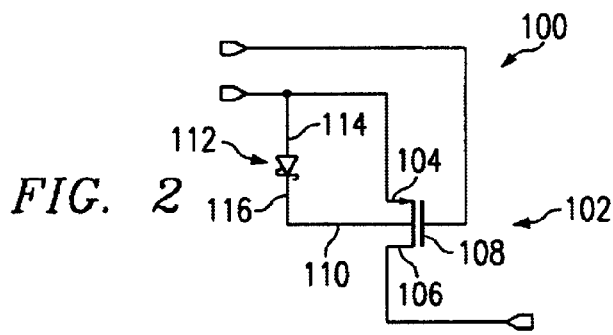
FIG. 2 is a schematic diagram illustrating a PMOS-Schottky structure according to an exemplary aspect of the present invention.

Turning now to the figures, FIG. 2 is a schematic diagram illustrating a PMOS-Schottky protection structure 100 according to one exemplary aspect of the present invention. The PMOS-Schottky structure 100 comprises a PMOS transistor 102 having a source terminal 104, a drain terminal 106, a gate terminal 108, and a backgate 110 associated therewith. The PMOS-Schottky structure 100 further comprises a Schottky type diode 112 having an anode terminal 114 and a cathode terminal 116, respectively. According to the exemplary aspect of FIG. 2, the Schottky diode 112 is coupled between the source 104 and the backgate 110 of the PMOS transistor 102. More particularly, the anode 114 of the Schottky diode 112 is coupled to the source 104 and the cathode 116 is coupled to the backgate 110. The PMOS-Schottky structure 100 operates to block current conduction therethrough when reverse biased and allow current conduction therethrough when forward biased, wherein the forward biased voltage drop is substantially less than traditional blocking diodes.

Figure 3A:
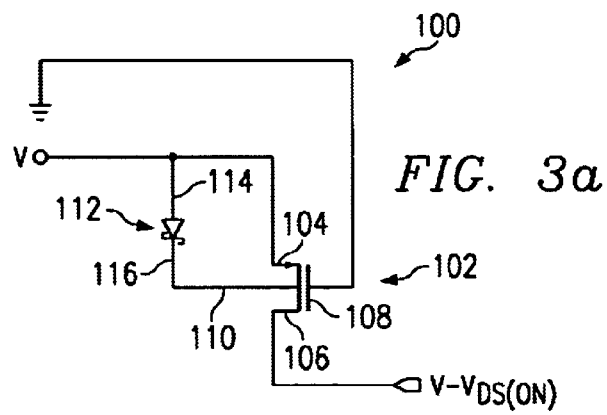
FIG. 3a is a schematic diagram illustrating the PMOS-Schottky structure of FIG. 2 under exemplary forward bias conditions.

According to one aspect of the present invention, an exemplary forward bias condition for the PMOS-Schottky structure 100 is illustrated in FIG. 3a. In this example, the gate terminal 108 of the PMOS transistor 102 is coupled to a first voltage potential (e.g., circuit ground potential), while the source terminal is coupled to a second voltage potential (V) which is greater than the first potential (e.g., about 5V). Under this forward bias condition, the gate 108 is less than a threshold voltage below the source 104 such that the PMOS transistor 102 is turned on. In addition, the Schottky diode 112 is forward biased, thereby biasing the backgate 110 at about a forward biased Schottky diode drop ($V_F$) below the second voltage potential (e.g., V–$V_F$), which is typically a fairly small value (e.g., about 0.1–0.5V). The biased backgate 110 does cause a slight modification of the threshold voltage ($V_t$) of the PMOS transistor 102, but such a slight modification is not sufficient to impact the conduction of the PMOS transistor 102. With the PMOS transistor 102 on, the voltage at the drain 106 is substantially close to the applied voltage potential (e.g., V–$V_{DS(ON)}$), thereby substantially passing the applied voltage potential to an output of the structure 100 for use by other circuitry. Note that since the forward biased voltage across the structure 100 is merely $V_{DS(ON)}$, the voltage headroom supplied by the structure 100 to other circuitry is increased substantially over a prior art blocking diode which may be highly advantageous in various circuit applications.

Figure 3B:
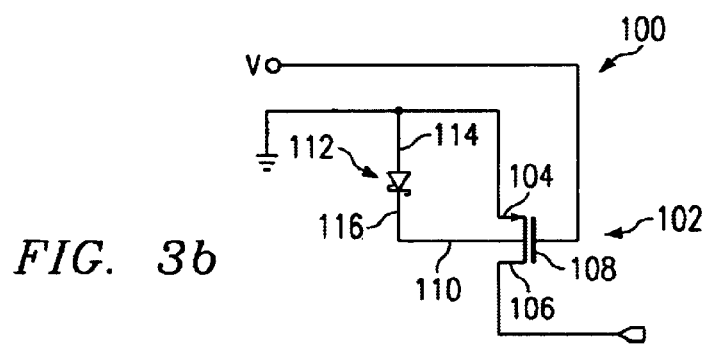
FIG. 3b is a schematic diagram illustrating the PMOS-Schottky structure of FIG. 2 under exemplary reverse bias conditions.

According to another exemplary aspect of the present invention, an exemplary reverse bias condition for the PMOS-Schottky structure 100 is illustrated in FIG. 3b. In this example, the source 104 of the PMOS transistor 102 is coupled to the first voltage potential (e.g., circuit ground potential) while the gate terminal 108 is coupled to the second voltage potential (V) which is greater than the first voltage. Under such circumstances, the PMOS transistor 102 is turned off because the gate terminal 108 is not a $V_t$ or more below the source terminal 104. In addition, the Schottky diode 112 is reverse biased because the backgate 110 is at a higher potential than the first potential (e.g., circuit ground potential). Consequently, current will not flow "backwards" through the PMOS-Schottky structure 100, thereby protecting any circuitry which may be coupled to an input thereof from reverse currents.

Figure 4:
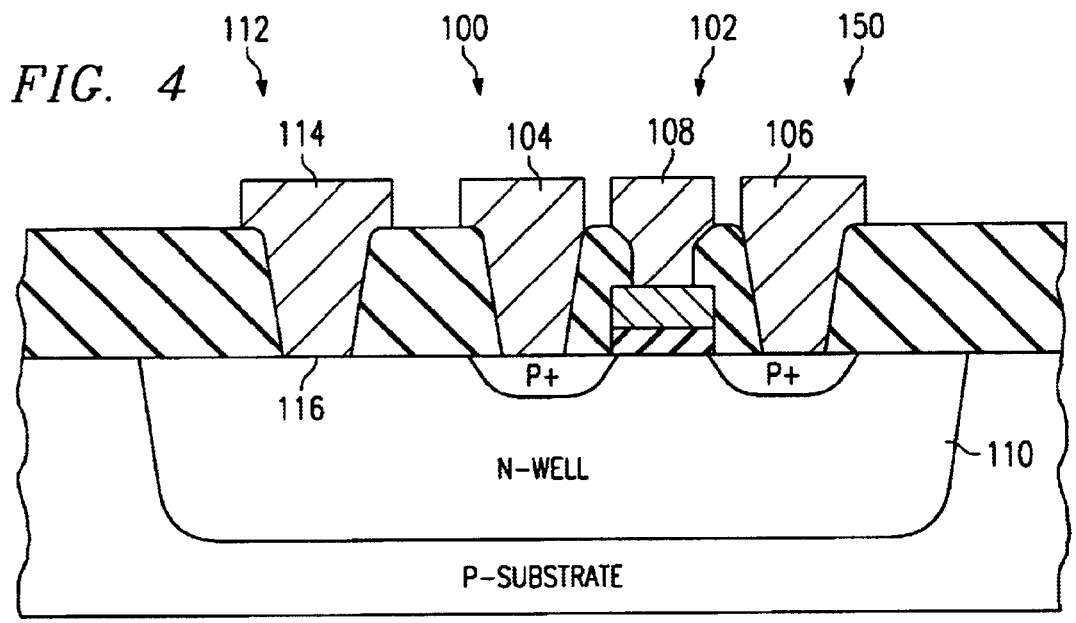
FIG. 4 is a cross section diagram illustrating an exemplary integrated circuit layout of a PMOS-Schottky structure according to the present invention.

To better understand why the Schottky diode 112 is reverse biased in the circuit conditions of FIG. 3b, an exemplary layout of a PMOS-Schottky structure 100 is illustrated in FIG. 4, and designated at reference numeral 150. In the exemplary layout 150, the PMOS transistor 102 is formed within an N-well 110 which resides in a P type substrate. The Schottky diode 112 is formed, for example, as a Schottky contact to the N-well 110.

As is generally well known, a Schottky diode may be constructed by a metal-semiconductor contact. A metal has a work function $q\phi_m$ which means that such an energy amount is required to remove an electron therefrom at the Fermi level to a vacuum outside the metal. When negative charge is brought near the metal surface, positive charge is induced in the metal, and when combined with an applied electric field, the effective work function is reduced, which is called the Schottky effect. This effect is employed in a Schottky diode.

When a metal with a work function $q\phi_m$ is brought into contact with a semiconductor which has a work function $q\phi_s$, charge transfer therebetween occurs until the respective Fermi levels align at equilibrium. In an n-type semiconductor such as that illustrated in FIG. 4, a depletion region forms near the metal-semiconductor junction and the electric field and bending of energy bands within the depletion region is similar to that of a p-n junction, and an equilibrium contact potential $V_o$ develops thereacross which prevents further electron diffusion.

When a forward bias voltage V is applied across the Schottky diode, the equilibrium contact potential is reduced to $V_o-V$, and electrons can diffuse more readily across the depletion region from the semiconductor material to the metal, giving rise to a forward current. Conversely, a reverse bias voltage (V) thereacross increases a barrier height associated with the depletion region from $V_o$ to $V_o+V$ and electron flow, and thus current, is reduced (e.g., becoming negligible in some instances). Thus the metal-semiconductor junction behaves in several respects as a rectifying contact or diode, wherein the forward bias voltage drop thereacross is less than many conventional type p-n junction diodes.

When the anode 114 of the Schottky diode 112 of FIGS. 3b and 4 goes low, for example, down to a circuit ground potential, the p-n junction formed at the substrate/N-well interface is typically forward biased, placing the N-well 110 (the cathode 116 of the Schottky diode 112) at a positive voltage potential with respect to the anode 114 (e.g., about 3V). Thus the Schottky diode 112 is reverse biased and, as discussed briefly above, its barrier height is increased, thus preventing current flow therethrough. Therefore the PMOS-Schottky structure 100 advantageously prohibits current flow therethrough under reverse bias conditions.

Although FIGS. 2–4 illustrate one exemplary configuration of a PMOS-Schottky structure, it should be understood that other configurations may be employed and such configurations are contemplated as falling within the scope of the present invention. For example, a circuit or structure that selectively employs or activates a transistor under forward bias conditions and a diode or other type current blocking device under reverse bias conditions may be utilized.

Figure 5:
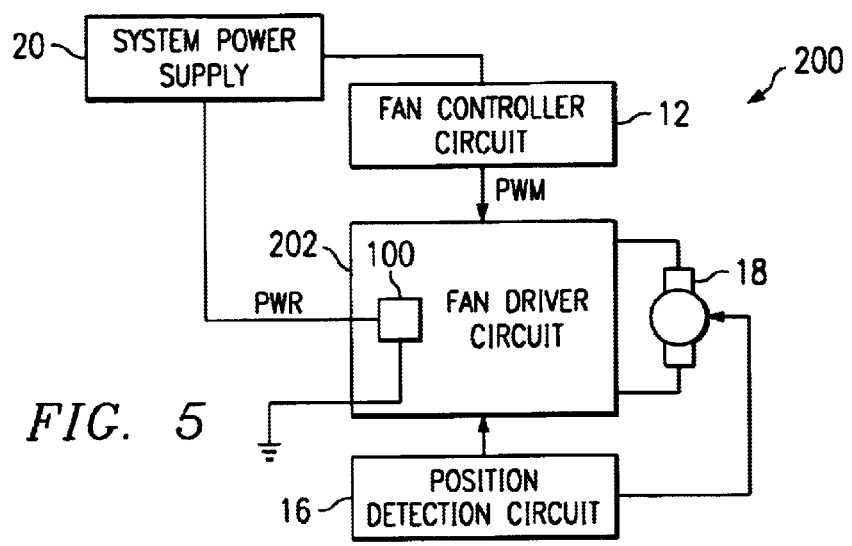
FIG. 5 is a system level block diagram illustrating a fan control circuit employing a PMOS-Schottky structure in accordance with an exemplary aspect of the present invention.

The PMOS-Schottky structure 100 may be employed in myriad circuit and system applications. For example, FIG. 5 is a system level block diagram 200 illustrating an exemplary control system for a DC brushless motor used, for example, to power a cooling fan in computer and/or handheld electronic device applications. The system 200 is similar in some respects to the prior art system 10 of FIG. 1, however, the system 200 differs in that the system comprises a fan driver circuit 202 which includes the PMOS-Schottky protection structure 100 of the present invention. According to one exemplary aspect of the present invention, the PMOS-Schottky structure 100 is integrated into the fan driver circuit chip to reduce system level board space, however, discrete structures 100 alternatively may be employed and are contemplated as falling within the scope of the present invention.

Figure 1:
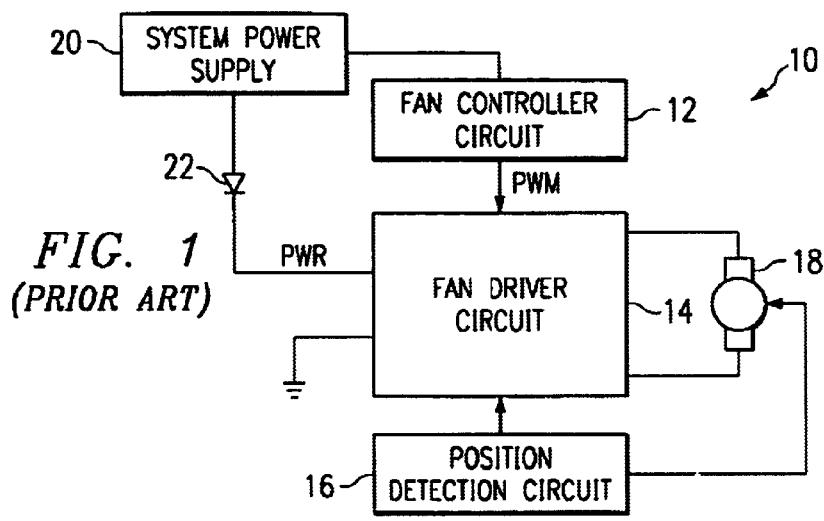
FIG. 1 is a system level block diagram of a prior art fan control circuit using a blocking diode for reverse current protection.

The PMOS-Schottky structure 100 in system 200 allows the blocking diode 22 of prior art FIG. 1 to be eliminated by preventing reverse currents from flowing to and potentially damaging the system power supply 20. In addition, the PMOS-Schottky structure exhibits a substantially reduced forward bias voltage drop thereacross when operating under normal system operating conditions as compared to the prior art blocking diode 22. For example, as discussed previously, the prior art blocking diode 22 limits the power supply voltage of circuits such as the fan driver circuit due to its substantial forward bias voltage drop thereacross (e.g., about 0.5–0.7V). Such a reduced power supply voltage to various circuits has several drawbacks, including reduced system performance due to lower power and shorter battery life in portable or other type system applications which employ a battery as the system power supply.

In stark contrast to the prior art blocking diode 22 of FIG. 1, the PMOS-Schottky structure 100 of the present invention exhibits a substantially reduced forward bias voltage drop thereacross under normal system operating conditions. That is, the PMOS-Schottky structure 100 exhibits a forward bias voltage drop thereacross of $V_{DS(ON)}$ (e.g., about 0.1V or lower) of the PMOS transistor 102 which is substantially less than a forward diode drop of prior art blocking devices. Consequently, substantially all of the voltage at the system power supply 20 is provided to the appropriate circuitry, which in the present example comprises the fan driver circuit 202 of FIG. 5. Therefore for any given voltage provided by the system power supply 20, the fan driver circuit 202 employing the PMOS-Schottky structure 100 will deliver more power and thus exhibit greater performance than the prior art system 10 of FIG. 1. Such performance improvements may be readily appreciated in conjunction with FIGS. 6 and 7, respectively.

Figure 6:
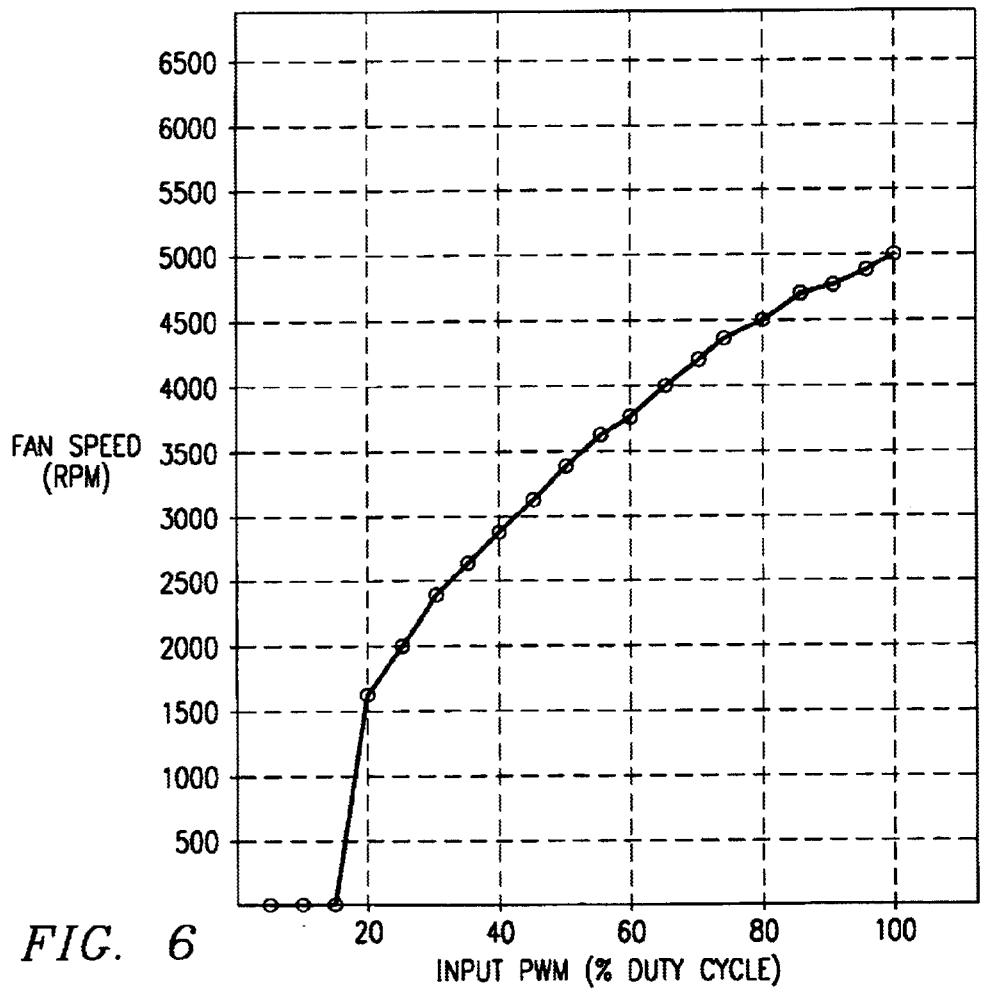
FIG. 6 is a graph illustrating a fan speed as a function of input PWM for the prior art system of FIG. 1.

FIG. 6 is a graph which illustrates a fan speed as dictated by the motor 18 of prior art FIG. 1 as a function of the input pulse width modulation (PWM) dictated by the fan controller circuit 12 and the fan driver circuit 14, respectively. As would be expected, as the duty cycle of the PWM is increased, the motor 18 receives more current and drives the fan harder, resulting in increased fan speed, as shown in FIG. 6. In particular, at PWM duty cycles of 20%, 40%, 60%, 80% and 100%, the fan speed in RPMs is about 1600, 2800, 3750, 4500 and 5000, respectively.

Figure 7:
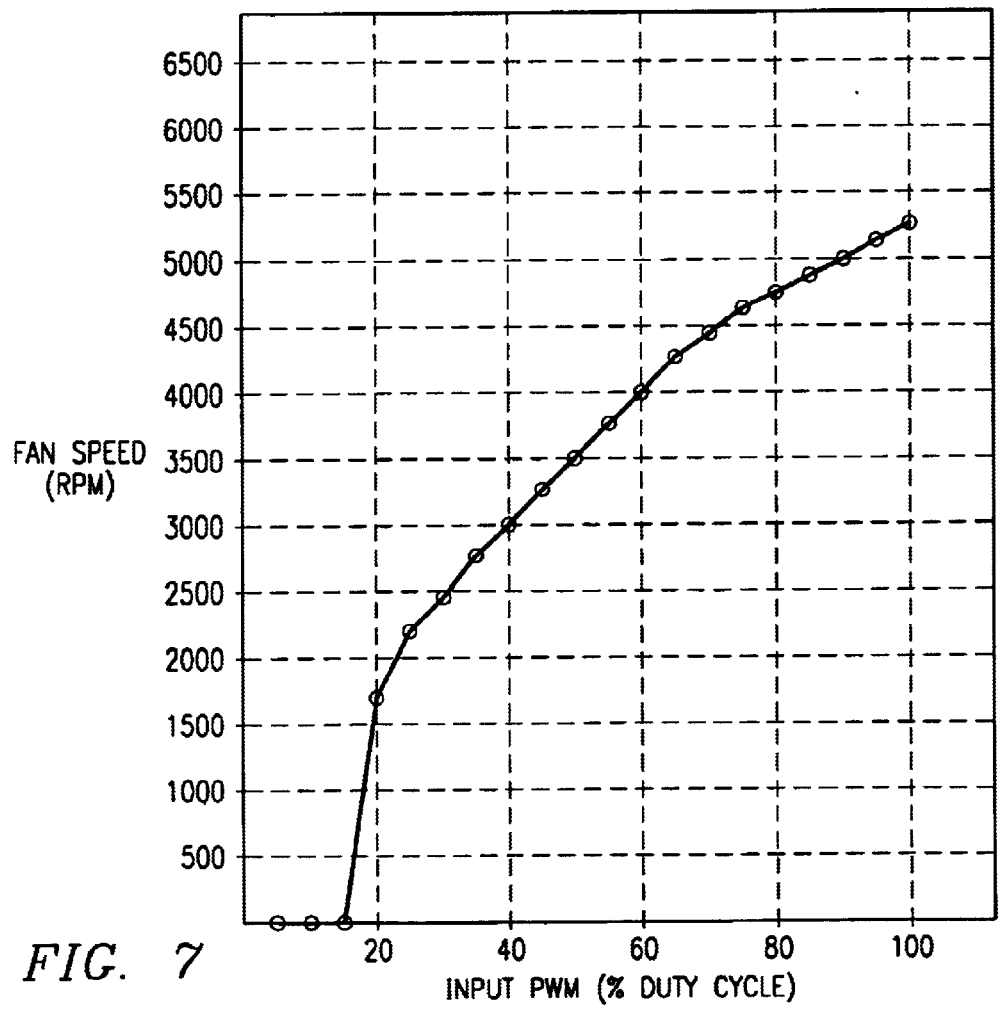
FIG. 7 is a graph illustrating a fan speed as a function of input PWM for the system employing the PMOS-Schottky structure of FIG. 5 according to one exemplary aspect of the present invention.

Turning now to FIG. 7, a graph is provided which illustrates the fan speed as dictated by the motor 18 in the system 200 of FIG. 5 which employs the PMOS-Schottky structure 100 of the present invention. As the PWM duty cycle of the system is increased, the fan speed also increases as would be expected. Note that in FIG. 7, however, for a given PWM duty cycle (and the same system power supply 20), the fan speed is substantially greater than that of system 10 of prior art FIG. 1. For example, at PWM duty cycles of 20%, 40%, 60%, 80% and 100%, RPMs of about 1700, 3000, 4000, 4750 and 5250 are measured, respectively, resulting in about an average performance improvement of about 6.1%.

Note that the PMOS-Schottky structure 100 readily protects the system 200 of FIG. 5 from reverse bias system conditions. For example, if a fan plug, which in many cases is not keyed (to allow only one insertion orientation) is plugged in backwards, the ground pin and the power pin are switched and the PMOS-Schottky structure 100 is reverse biased in a manner similar to that described above in conjunction with FIG. 3b. In such instances, no reverse current conducts through the structure 100, thus protecting both the power supply 20 and the fan from damage. In addition, the PMOS-Schottky structure 100 may be easily integrated into chips it is designed to protect such as, for example, the fan driver circuit 202 of FIG. 5. With such integration, a discrete protection component is eliminated, thereby reducing the necessary PCB space and reducing the component count, and thus improving manufacturability while reducing cost.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A reverse bias protection structure, comprising:
    a P-type substrate;
    an N-type well residing within the P-type substrate;
    a PMOS transistor structure residing within the N-type well, having a drain portion, a gate portion, a source portion and a backgate portion, wherein the gate portion is coupled to a first voltage potential, the source portion is selectively coupleable to a power supply, and the drain portion is selectively coupleable to a circuit needing power to be supplied thereto from the power supply, and wherein the N-type well comprises the backgate portion thereof; and
    a Schottky diode structure comprising a metal contact formed on a portion of the N-type well and forming a Schottky contact via a metal/semiconductor interface, the Schottky diode structure having an anode coupled to the source portion of the PMOS transistor structure, and a cathode coupled to the backgate portion of the PMOS structure, wherein the Schottky contact comprises a rectifying contact, thereby rendering the Schottky contact a Schottky barrier diode, wherein a reverse bias voltage in which a potential of the N-type well exceeds a potential of the metal contact results in a negligible current flow from the N-type well to the metal contact.

2. A system for controlling a component receiving electrical energy, comprising:
    a system power supply;
    a component for providing a predetermined system function;
    a component driver circuit operably coupled to the system power supply and the component, and adapted to provide driver signals to the component to effectuate the predetermined system function; and
    a protection structure associated with the component driver circuit, wherein the protection structure is operable to substantially prevent a reverse current from conducting from the component driver circuit to the system power supply in a reverse bias condition, and operable to substantially pass a system power supply voltage value to the component driver circuit in a forward bias condition, wherein the protection structure comprises:
    a Schottky diode structure having a cathode coupled to the system power supply, and an anode; and
    a PMOS transistor structure having a source coupled to the cathode, a gate coupled to a system ground potential, a drain coupled to the component control circuit, and a backgate coupled to the anode of the Schottky diode.

3. A fan driver circuit, comprising:
    a fan controller circuit operable to generate one or more control signals for operating a fan motor;
    a fan driver circuit operably coupled to the fan controller circuit and operable to drive the fan motor in response to the one or more control signals;
    a power supply operable to provide energy to the fan controller circuit and the fan driver circuit, respectively;
    a PMOS-Schottky protection structure; and
    a fan driven by the fan motor,
    wherein if the fan is properly connected to the fan motor, a forward biased condition results, and the PMOS-Schottky protection structure is operable to couple a voltage of the power supply to the fan driver circuit with a voltage drop thereacross which is less than a forward bias diode voltage drop, and
    wherein if the fan is improperly connected to the fan motor, a reverse bias condition results, and the PMOS-Schottky protection is operable to prevent a reverse current from conducting from the fan driver circuit to the power supply, and
    wherein the PMOS-Schottky protection structure comprises:
    a PMOS transistor having a source terminal, a gate terminal, a drain terminal and a backgate; and
    a Schottky diode structure having an anode terminal coupled to the source terminal and a cathode terminal coupled to the backgate of the PMOS transistor, respectively,
    wherein under forward bias conditions, the gate terminal is at a low voltage with respect to the source terminal, thereby causing the PMOS transistor to turn on and conduct current from the power supply to the fan driver circuit, and
    wherein under reverse bias conditions, the gate terminal is at a high voltage with respect to the source terminal, thereby causing the PMOS transistor to turn off, and the backgate of the PMOS transistor is at a high voltage with respect to the source terminal, thereby causing the Schottky diode to be reverse biased and prevent current from conducting therethrough.

4. The circuit of claim 3, wherein under forward bias conditions, a voltage drop across the PMOS-Schottky protection structure is about a $V_{DS(ON)}$ of the PMOS transistor.

* * * * *